(12) United States Patent
Isa et al.

(10) Patent No.: US 8,604,601 B2
(45) Date of Patent: Dec. 10, 2013

(54) SEMICONDUCTOR DEVICE HAVING WIRING LAYERS WITH POWER-SUPPLY PLANE AND GROUND PLANE

(75) Inventors: Satoshi Isa, Tokyo (JP); Mitsuaki Katagiri, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 606 days.

(21) Appl. No.: 12/708,320

(22) Filed: Feb. 18, 2010

(65) Prior Publication Data
US 2010/0213611 A1 Aug. 26, 2010

(30) Foreign Application Priority Data

Feb. 20, 2009 (JP) .................................. 2009-038363
Jan. 8, 2010 (JP) .................................. 2010-003217

(51) Int. Cl.
*H01L 23/48* (2006.01)
*H01L 23/52* (2006.01)
*H01L 29/40* (2006.01)

(52) U.S. Cl.
USPC ........... 257/692; 257/737; 257/738; 257/773; 257/782; 257/E23.012; 257/E23.069

(58) Field of Classification Search
None
See application file for complete search history.

(56) References Cited

U.S. PATENT DOCUMENTS

| | | | | |
|---|---|---|---|---|
| 6,605,876 | B2* | 8/2003 | Chang et al. | 257/781 |
| 6,713,853 | B1* | 3/2004 | Fazelpour et al. | 257/680 |
| 6,882,266 | B2* | 4/2005 | Christian et al. | 338/320 |
| 6,995,320 | B2* | 2/2006 | Kusakabe et al. | 174/260 |
| 2005/0104209 | A1* | 5/2005 | Kang | 257/737 |
| 2008/0173987 | A1* | 7/2008 | Koshiishi et al. | 257/665 |

FOREIGN PATENT DOCUMENTS

JP 10-173087 6/1998

* cited by examiner

*Primary Examiner* — Michael Jung
(74) *Attorney, Agent, or Firm* — Morrison & Foerster LLP

(57) ABSTRACT

A semiconductor device of the invention includes a first wiring layer including a signal wiring line formed therein, and a second wiring layer stacked on the first wiring layer and including a power-supply plane and/or ground plane formed therein, the power-supply plane or the ground plane is not formed at least within a part of the region of the second wiring layer facing the signal wiring line of the first wiring layer.

19 Claims, 14 Drawing Sheets

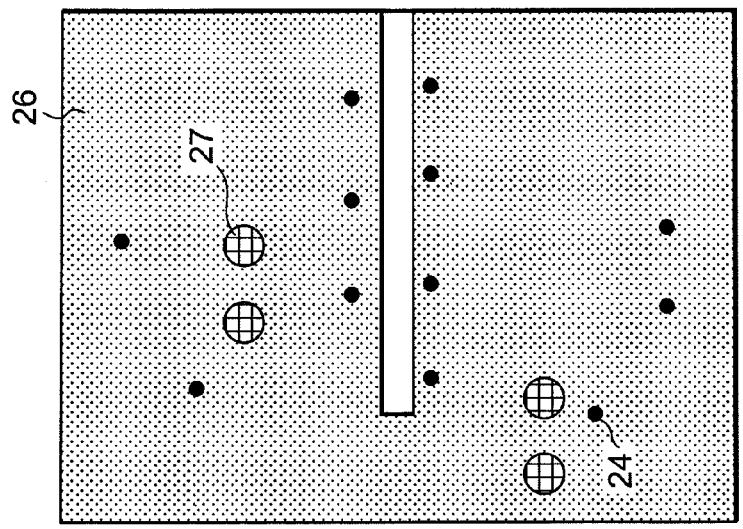
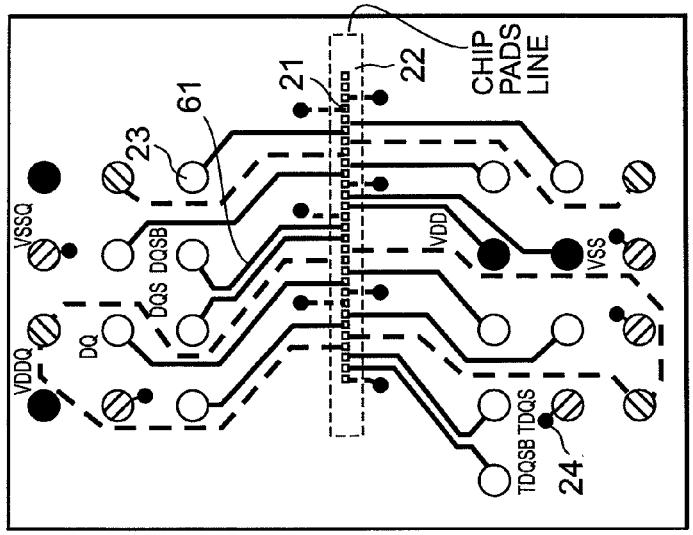
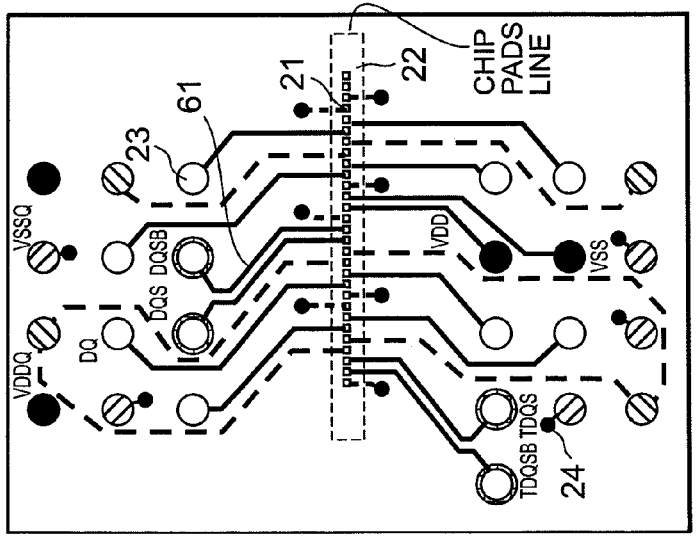
FIG. 7C
FIG. 7B
FIG. 7A

SEMICONDUCTOR DEVICE HAVING WIRING LAYERS WITH POWER-SUPPLY PLANE AND GROUND PLANE

This application is based upon and claims the benefit of priority from Japanese Patent Application No. 2009-038363, filed on Feb. 20, 2009, and Japanese Patent Application No. 2010-003217, filed on Jan. 8, 2010, the entire contents of which are incorporated herein by reference.

BACKGROUND OF THE INVENTION

1. Field of the Invention

This invention relates to a semiconductor device and, in particular, to a package board for use in a semiconductor device.

2. Description of Related Art

With a decrease of an operating voltage of semiconductor devices manufactured by mounting a semiconductor chip on a package board, there has arisen a demand for semiconductor packages having a reduced impedance in wiring lines which supply power and ground to semiconductor chips.

SUMMARY

Disclosure is made in Japanese Laid-Open Patent Publication No. H10-173087 (Patent Document 1) about a multi-layer wiring board. In addition to the multi-layer wiring board, Patent Document 1 also discloses a technology reducing the parasitic capacitance generated between a plated wiring and a power-supply plane formed in the multi-layer wiring board. However, the inventors of this invention have found that, in order to realize further improvement in operating frequency of semiconductor devices, it is imperative to reduce the parasitic capacitance between signal wiring (other than plated wiring) and power-supply and ground planes. The planes may take either a form filled with copper foil or a mesh-like porous form. The term "plane" as used herein means a pattern in general having a greater width than linear wiring lines.

In one embodiment, there is provided a semiconductor device that comprises a first wiring layer comprising a signal wiring line formed therein, and a second wiring layer stacked on the first wiring layer and comprising a power-supply plane or ground plane formed therein. The power-supply plane or the ground plane is not formed at least in a part of the region of the second wiring layer facing the signal wiring line of the first wiring layer.

In one embodiment, there is provided a semiconductor device that comprises a first wiring layer comprising a signal wiring line formed therein; and a second wiring layer stacked on the first wiring layer with an insulation layer interposed therebetween, and comprising a power-supply plane or ground plane formed therein, wherein the power-supply plane or the ground plane, or other power-supply plane or the ground plane formed in the first wiring layer is not provided in at least a part of the region facing the signal wiring line of the first wiring layer or the solder ball land connected thereto of the second wiring layer.

In one embodiment, there is provided a semiconductor device that comprises an insulating layer comprising a signal wiring line formed in one surface thereof; and, a first wiring pattern formed in other surface and fixed to a first power supply potential, wherein the first wiring pattern is wider than a signal wiring line; and, a semiconductor element comprising an electrode fixed to the insulating layer and connected to the signal wiring line, wherein the first wiring pattern is not provided in a part of a region of the other surface corresponding thereto.

According to this invention, the semiconductor device is constructed so as to remove a power supply plane and a ground plane in a part of a region where electrostatic coupling with the signal wiring line may occur. Thus, the parasitic capacitance generated between signal wiring lines and power-supply or ground planes can be reduced.

BRIEF DESCRIPTION OF THE DRAWINGS

The above features and advantages of the present invention will be more apparent from the following description of certain preferred embodiments taken in conjunction with the accompanying drawings, in which:

FIG. 7A is a plan view for explaining a package board for use in a semiconductor device according to a fifth embodiment of the invention, and showing a wiring pattern formed in a first wiring layer 16-1 overlapped with a void pattern formed in a second wiring layer 16-2;

FIG. 7B is a plan view for explaining the package board for use in the semiconductor device according to the fifth embodiment, and showing the wiring pattern formed in the first wiring layer 16-1;

FIG. 7C is a plan view for explaining the package board for use in the semiconductor device according to the fifth embodiment, and showing a ground plane pattern (and the void pattern) in the second wiring layer 16-2;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
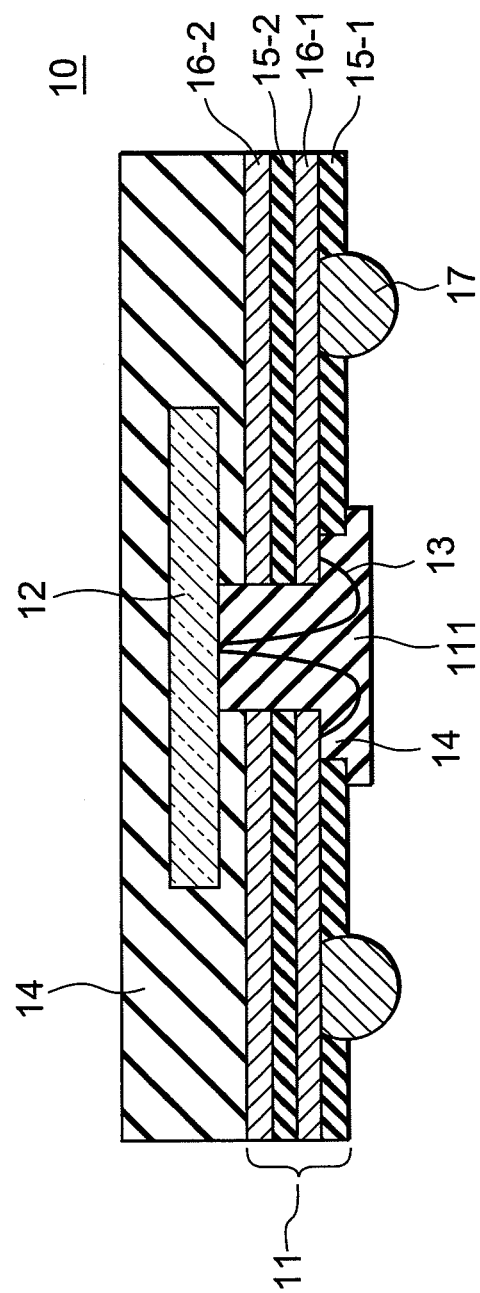
FIG. 1 is a cross-sectional view showing a schematic configuration of a semiconductor device according to a first embodiment of this invention.

FIG. 1 is a cross-sectional view showing a schematic configuration of a semiconductor device according to a first embodiment of this invention. The semiconductor device is structured in the form of a BGA (Ball Grid Array) package.

The shown semiconductor device 10 has a package board (multi-layer wiring board) 11, a semiconductor chip (a semiconductor element) 12 mounted on this package board 11, a bonding wire 13 connecting between the semiconductor chip 12 and the package board 11, and mold resin 14 sealing the semiconductor chip 12 and the bonding wire 13. The package board 11 has a slot (opening) 111 formed in the center thereof while the semiconductor chip 12 may be, for example, DRAM.

The package board 11 is formed by alternately stacking an insulation layer 15-1, 15-2 and first and second wiring layers (metal layer) 16-1, 16-2. The package board 11 comprises solder balls 17 formed on the first wiring layer 16-1 to pass through the insulation layer 15-1 and to be connected to solder ball lands 23 (to be described later).

Figure 2A:
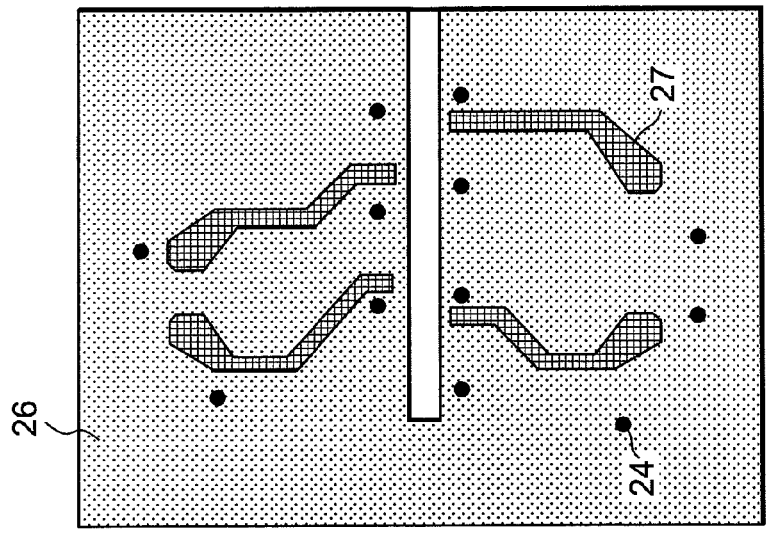
FIG. 2A is a plan view showing a wiring pattern formed in a first wiring layer 16-1 of the semiconductor package board of FIG. 1 for use in a semiconductor device, overlapped with a void pattern in a second wiring layer 16-2 thereof.
Figure 2B:
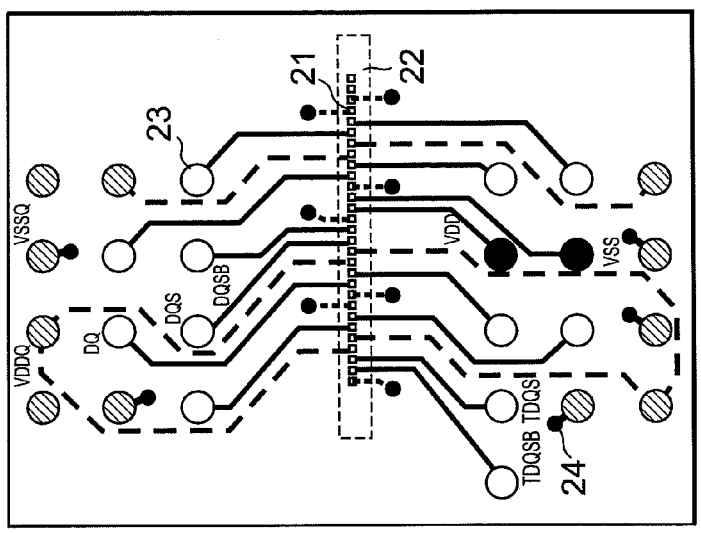
FIG. 2B is a plan view showing the wiring pattern formed in the first wiring layer 16-1.
Figure 2C:
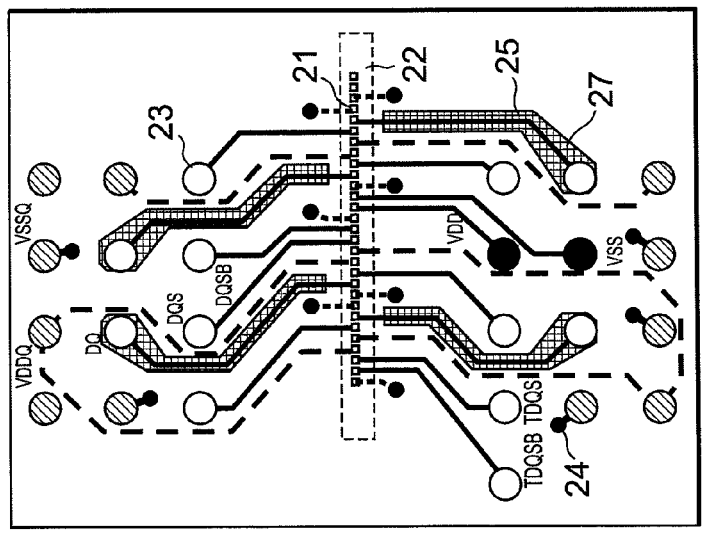
FIG. 2C is a plan view showing a ground plane pattern (and the void pattern) formed in the second wiring layer 16-2.

FIG. 2A is a plan view showing a state of overlapping a wiring pattern formed in the first wiring layer 16-1 with a void pattern formed in the second wiring layer 16-2. FIG. 2B is a plan view showing the wiring pattern in the first wiring layer 16-1, and FIG. 2C is a plan view showing a source pattern (ground plane pattern and void pattern are employed herein) in the second wiring layer 16-2. Thus, FIG. 2A is a diagram showing a state in which the wiring pattern of FIG. 2B is overlapped with the ground plane pattern of FIG. 2C.

In FIG. 2A and FIG. 2B, dotted squares arranged along a center line represent bonding pads (electrodes) 21 (also referred to simply as pads) to be connected to the semiconductor chip 12 (FIG. 1). Although FIG. 1 shows the bonding wire 13 extended from a central part of the semiconductor chip 12 to opposite directions, FIG. 2A and FIG. 2B show, for the sake of simplification, a state in which bonding pads 21 are arranged in a single row (there is a single pad area 22). In FIGS. 2A and 2B, larger circles represent solder ball lands 23 (also referred to simply as lands) to be connected to the solder balls 17. These circles are hatched differently depending on intended purposes of the solder balls 17. The lands 23 to be connected to DQ solder balls are represented by open circles (not hatched). The term "DQ" as used herein means a data signal (DQ) and data strobe signal (DQS and DQSB). Smaller and filled circles in FIGS. 2A and 2B represent through electrodes 24. Wiring lines formed between the pads 21 and the solder ball lands 23, between the pads 21 and the through electrodes 24, and between the solder ball lands 23 and the through electrodes 24 are represented by solid or broken lines. The wiring lines connecting the lands 23 for the DQ solder balls to the DQ pads 21 are particularly referred to as signal wiring lines 25.

FIG. 2C is largely occupied by a hatched portion which represents a ground plane 26. In other words, the ground plane 26 is formed in a substantially whole area of the second wiring layer 16-2 (to cover 50% or more of the surface area). In FIG. 2C, each of the filled circles represents a through electrodes (a plated through hole or a via hole) 24 in which a hole made in the insulating layer 15-2 is filled with conductive materials such as a metal. These through electrodes 24 correspond to the through electrodes 24 in the first wiring layer 16-1. Smaller regions in FIG. 2C which are hatched differently from the ground plane 26 represent void patterns 27 (may be called void regions) which are void of the ground plane 26 in this example. Each of the void patterns 27 is formed to correspond to a predetermined one of the signal wiring lines 25 formed in the first wiring layer 16-1 and to solder ball lands 23 connected thereto. Accordingly, the ground plane 26 is not formed in the regions facing the predetermined signal wiring lines 25 and the solder ball lands 23 connected to these signal wiring lines 25 in the second wiring layer 16-2 (the second wiring layer 16-2 is exposed). In other words, a source pattern which is fixed to a power supply potential and which has a width wider than the signal wiring lines is not formed on the other surface of the insulating layer 15-2. This configuration is the same as in the other embodiments described later. Each of the void patterns 27 is formed to be slightly larger than the corresponding signal wiring line 25 and solder ball land 23.

As described above, according to this embodiment, the semiconductor device is constructed so as to partially remove a power supply plane and a ground plane from a part of a region where electrostatic coupling with the signal wiring line may be caused to occur. Accordingly, the parasitic capacitance between signal wiring lines 25 and ground planes can be suppressed or reduced.

Figure 3A:
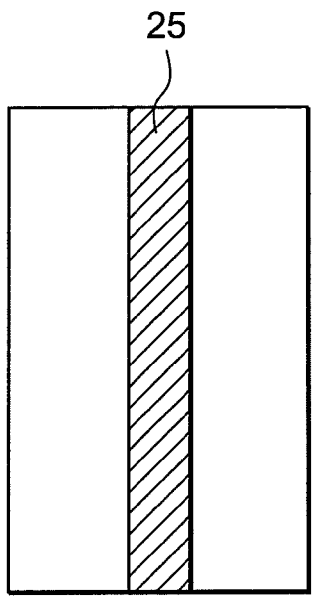
FIG. 3A is a plan view showing a part of a signal wiring line 25 formed in the first wiring layer 16-1 and a periphery thereof.
Figure 3B:
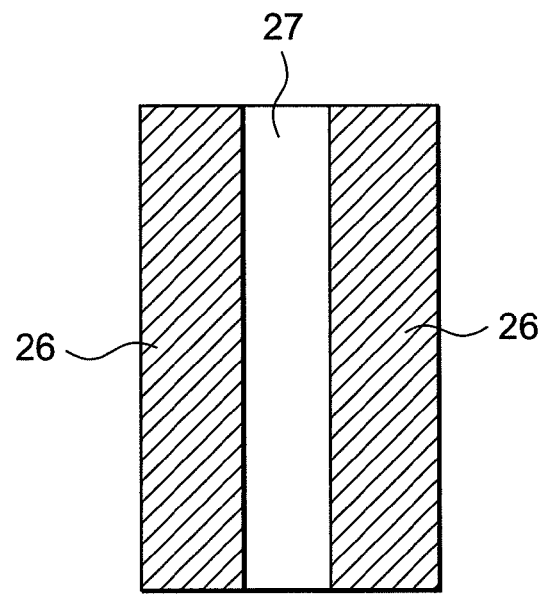
FIG. 3B is a plan view showing a part of a void pattern 27 formed in the second wiring layer 16-2 to correspond with the signal wiring line 25 and a periphery thereof.
Figure 3C:
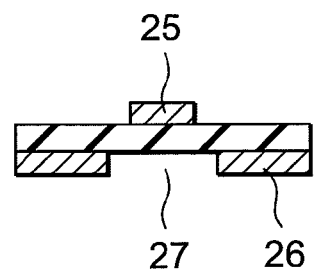
FIG. 3C is cross-sectional view showing the signal wiring line 25 and the void pattern 27.

The relationship between the signal wiring line 25 and the corresponding void pattern 27 (ground plane 26) is illustrated in FIG. 3A, FIG. 3B and FIG. 3C. FIG. 3A is a plan view showing a part of the signal wiring line 25 formed in the first wiring layer 16-1 and a periphery thereof. FIG. 3B is a plan view showing a part of the void pattern 27 formed in a region of the second wiring layer 16-2 which faces the signal wiring line 25 positioned outside of the void pattern 27. FIG. 3C is a cross-sectional view of the signal wiring line 25 and the void pattern 27.

Referring again to FIG. 2C, the ground plane 26 occupies a large part of the surface of the second wiring layer 16-2, and is connected to the pads 21 and the solder ball lands 23 through the plurality of through electrodes 24. Therefore, the package board according to this first embodiment of the invention makes it possible to reduce an impedance in comparison with that of a conventional package board in which a ground plane is formed to cover the whole surface of the second wiring layer 16-2.

As shown in FIG. 3C, the void pattern 27 which is void of any pattern is formed in a region of the second wiring layer 16-2 facing the signal wiring line 25 and the solder ball land 23 in the first wiring layer 16-1, whereby the parasitic capacitance can be reduced between the ground plane 26 and both of the signal wiring line 25 and the solder ball land 23 connected thereto. According to this configuration, not only the ground plane is not faced to the signal wiring line 25, but also the ground wiring is not also included in the wiring layer for the signal wiring line 25 (this means that no ground wiring exists around the signal wiring line 25). As a result, the parasitic capacitance of the signal wiring line 25 becomes equivalent to, or less than that of a single-layer board having only one wiring layer.

Next, a package board according to a second embodiment of this invention will be described.

Figure 4A:
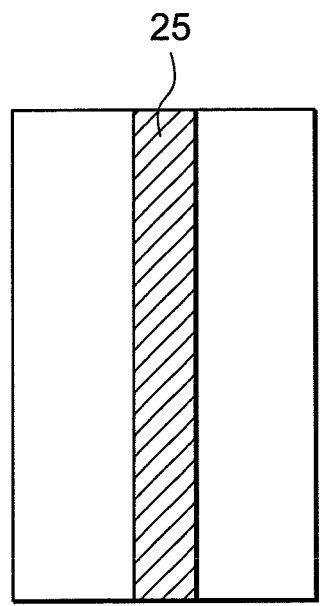
FIG. 4A is a plan view illustrating a part of a package board for use in a semiconductor device according to a second embodiment of the invention, and showing a part of a signal wiring line 25 formed in a first wiring layer 16-1 and a periphery of that part.
Figure 4B:
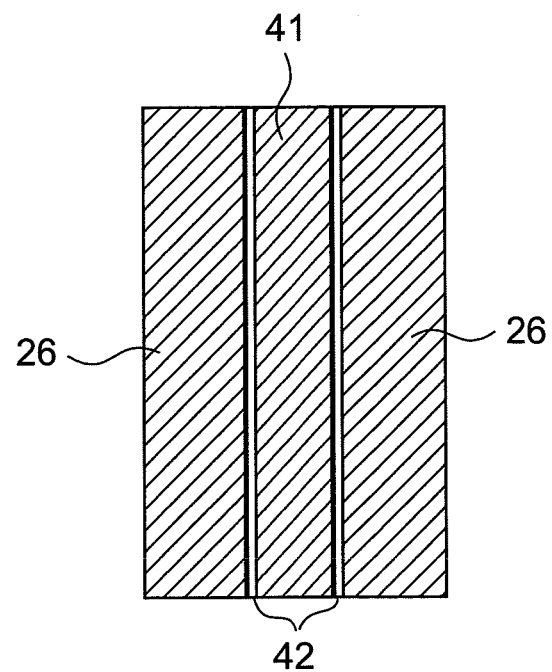
FIG. 4B is a plan view illustrating a part of the package board for use in the semiconductor device according to the second embodiment of the invention, and showing a part of a void pattern 27 formed in a second wiring layer 16-2 to correspond with the signal wiring line 25 and a periphery of that part.
Figure 4C:
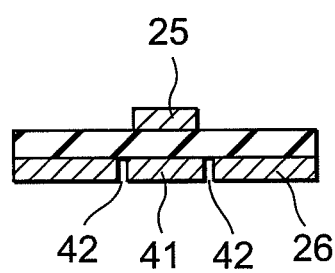
FIG. 4C is a cross-sectional view illustrating a part of the package board for use in the semiconductor device according to the second embodiment of the invention, and showing the signal wiring line 25 and the void pattern 27.

As shown in FIG. 4A, FIG. 4B and FIG. 4C, a package board according to the second embodiment comprises a floating pattern 41 formed in a second wiring layer 16-2 where a ground plane 26 is formed such that the floating pattern 41 is electrically isolated from the ground plane 26. The other configurations are the same as those in the first embodiment.

If the proportion occupied by a void pattern 27 in the second wiring layer 16-2 where the ground plane 26 is formed is increased, the possibility of warpage of the package board 11 increases. According to the second embodiment, however, the warpage of the package board can be prevented or suppressed by forming the floating pattern 41 in the void pattern 27. The floating pattern 41 may be formed by forming grooves 42 in the ground plane which has been formed to cover the whole surface, such that the floating pattern 41 remains. The package board comprising the floating pattern 41 formed therein shows almost the same electrical characteristics as those of the one comprising the void pattern 27 formed therein.

Next, a package board for use in a semiconductor device according to a third embodiment of this invention will be described.

Figure 5C:
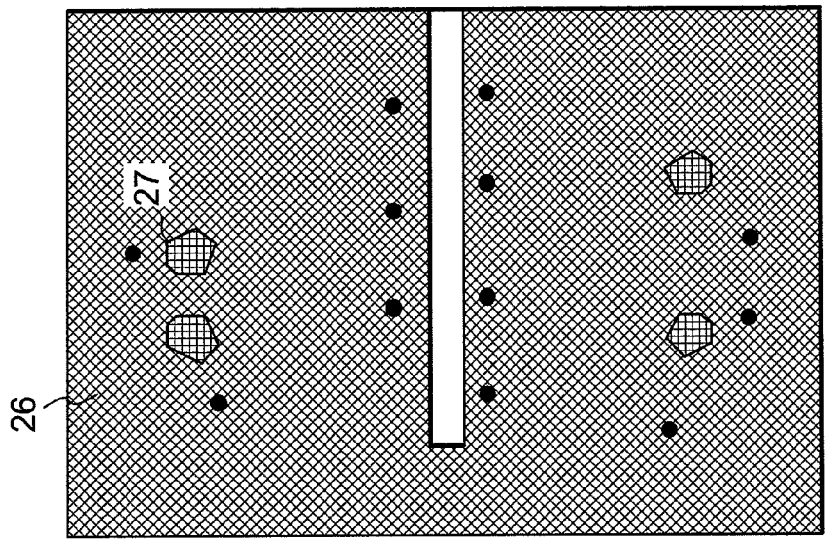
FIG. 5C is a plan view for explaining the package board for use in the semiconductor device according to the third embodiment, and showing a ground plane pattern (and the void pattern) in the second wiring layer 16-2.
Figure 5B:
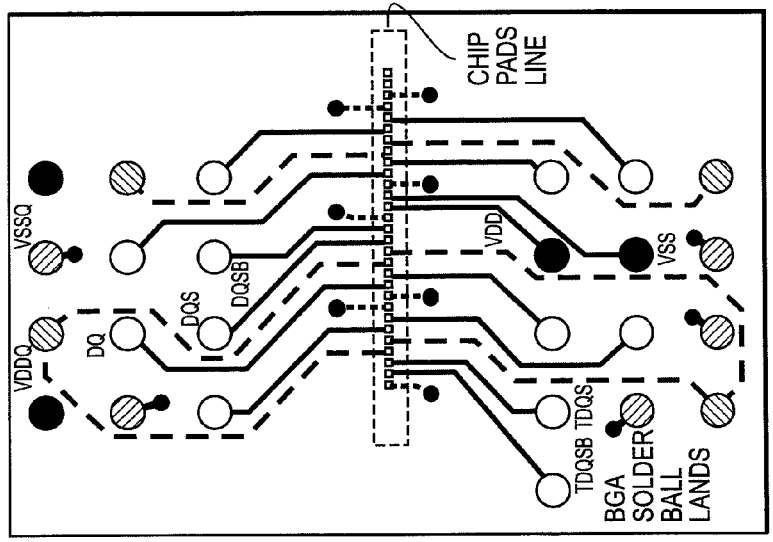
FIG. 5B is a plan view for explaining the package board for use in the semiconductor device according to the third embodiment, and showing the wiring pattern formed in the first wiring layer 16-1.
Figure 5A:
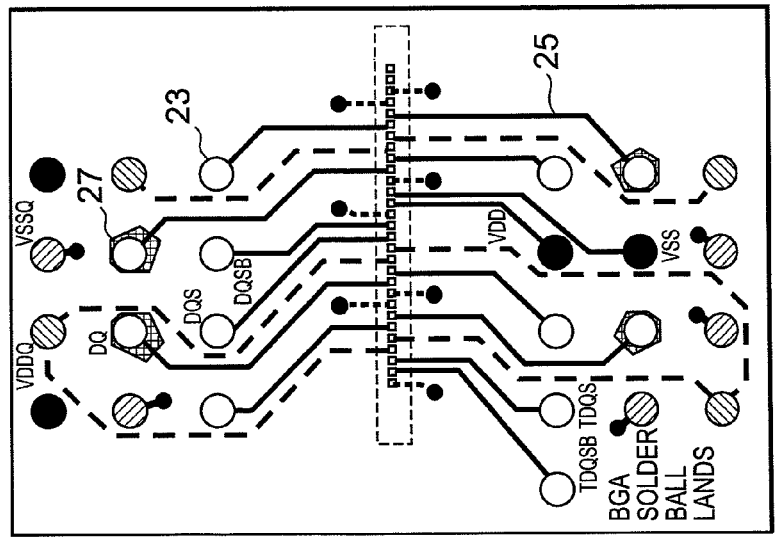
FIG. 5A is a plan view for explaining a package board for use in a semiconductor device according to a third embodiment of the invention, and showing a wiring pattern formed in a first wiring layer 16-1 overlapped with a void pattern formed in a second wiring layer 16-2.

The description of the first and second embodiment has been made in terms of a case in which the void pattern 27 or the floating pattern 41 is formed in a region or an area facing the signal wiring line 25 and the solder ball land 23 connected thereto. According to the third embodiment, however, as shown in FIG. 5A, FIG. 5B and FIG. 5C, no void pattern or floating pattern is formed in a region or an area facing the signal wiring line 25, but a void pattern 27 or a floating pattern 41 is formed in an area or region of the wiring layer 16-2 which is opposite to each solder ball land 23 connected to the signal wiring line 25. In other words, the void pattern 27 or the floating pattern 41 is formed at the area which surrounds each solder ball land 23 on an opposite side of the wiring layer 16-2.

The solder ball land 23 comparatively occupies a large area, and thus more likely produces a large parasitic capacitance with the ground plane 26, as compared with the signal wiring line 25. Therefore, if the signal wiring line 25 has a parasitic capacitance the value of which is close to a desired value, only the parasitic capacitance generated around the solder ball land 23 need be reduced.

Next, a package board for use in a semiconductor device according to a fourth embodiment of this invention will be described. Like the first embodiment, the package board according to the fourth embodiment also comprises first and second wiring layers 16-1 and 16-2 stacked with an insulation layer interposed therebetween.

Figure 6C:
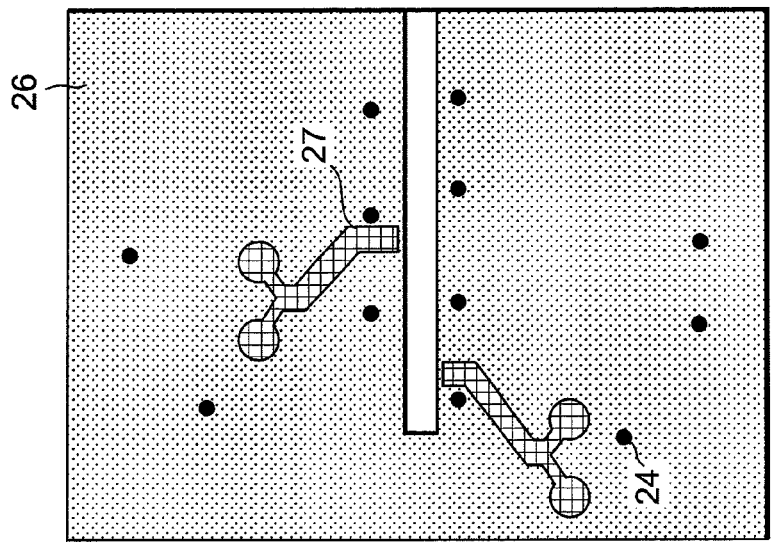
FIG. 6C is a plan view for explaining the package board for use in the semiconductor device according to the fourth embodiment, and showing a ground plane pattern (and the void pattern) formed in the second wiring layer 16-2.
Figure 6B:
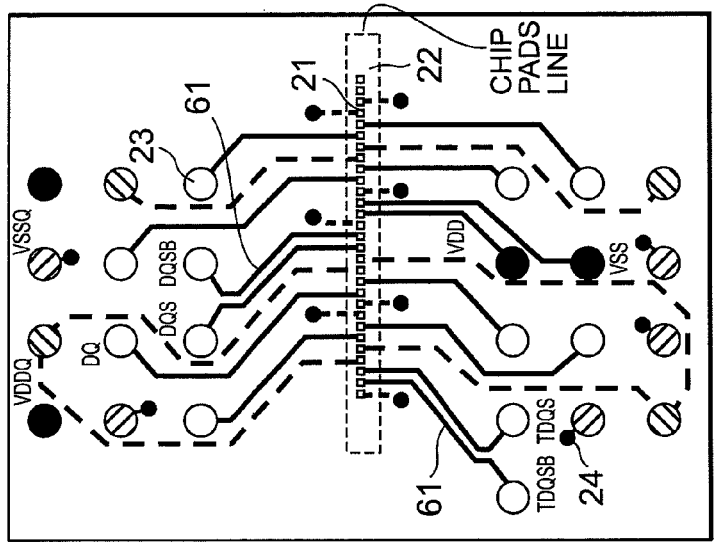
FIG. 6B is a plan view for explaining the package board for use in the semiconductor device according to the fourth embodiment, and showing the wiring pattern formed in the first wiring layer 16-1.
Figure 6A:
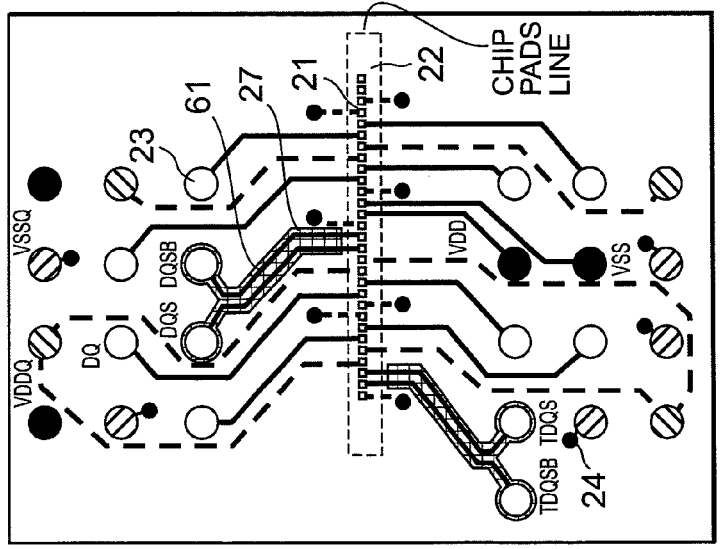
FIG. 6A is a plan view for explaining a package board for use in a semiconductor device according to a fourth embodiment of the invention, and showing a wiring pattern formed in a first wiring layer 16-1 overlapped with a void pattern formed in a second wiring layer 16-2.

FIG. 6A, FIG. 6B and FIG. 6C are diagrams corresponding to FIG. 2A, FIG. 2B and FIG. 2C, respectively. Specifically, FIG. 6A is a diagram showing a wiring pattern formed in the first wiring layer 16-1 overlapped with a void pattern formed in the second wiring layer 16-2. FIG. 6B is a diagram showing the wiring pattern in the first wiring layer 16-1, and FIG. 6C is a diagram showing a ground plane pattern (and the void pattern) in the second wiring layer 16-2.

Signal wiring lines 25 include lines for transmitting differential signals, and such signal wiring lines shall hereinafter be referred to as differential wiring lines 61. The differential wiring lines 61 desirably have a differential impedance of a predetermined value (e.g. 100Ω). However, if the differential wiring line 61 and the solder ball land 23 connected thereto are opposed to the ground plane 26, a parasitic capacitance will be caused to occur between the ground plane 26, and the differential wiring line 61 and the solder ball land 23. Such a parasitic capacitance brings about a reduction of the differential impedance. Therefore, it often happens that impedance mismatching is caused to occur between the package board (semiconductor package) and a printed circuit board on which the package board is mounted. According to this fourth embodiment, the void patterns 27 are each formed in a region of the second wiring layer 16-2 facing the differential wiring line 61 and the solder ball land 23 connected thereto to reduce the parasitic capacitance, and to thereby prevent or suppress the reduction of the differential impedance. As a result, it is possible to prevent or suppress the occurrence of impedance mismatching between the package board and the printed circuit board on which the package board is mounted.

Like the second embodiment, instead of forming the void pattern 27, a floating pattern may be formed in the second wiring layer 16-2 to be electrically isolated from the ground plane 26.

Next, a package board for use in a semiconductor device according to a fifth embodiment of this invention will be described.

The description above of the fourth embodiment has been made in terms of a case in which the void pattern 27 or floating pattern is formed in a region facing the differential wiring line 61 and the solder ball land 23 connected thereto. In this fifth embodiment, however, as shown in FIG. 7 A, FIG. 7 B and FIG. 7 C, no void pattern or floating pattern is formed in the region facing the differential wiring line 61 but a void pattern 27 or floating pattern is formed in a region of the wiring layer 16-2 facing the solder ball land 23 connected to the corresponding differential wiring line 61.

The solder ball land 23 occupies a large area, and thus more likely shows a large parasitic capacitance between the solder ball land 23 and the ground plane 26, as compared with the differential wiring line 61. Therefore, if the differential wiring line 61 has a parasitic capacitance the value of which is close to a desired value, only the parasitic capacitance around the solder ball land 23 need be reduced. This makes it possible to eliminate or reduce the discontinuity in differential impedance at the boundary between the solder ball land 23 and the differential wiring line 61.

Next, a package board according to a sixth embodiment for use in a semiconductor device of this invention will be described.

Figure 8:
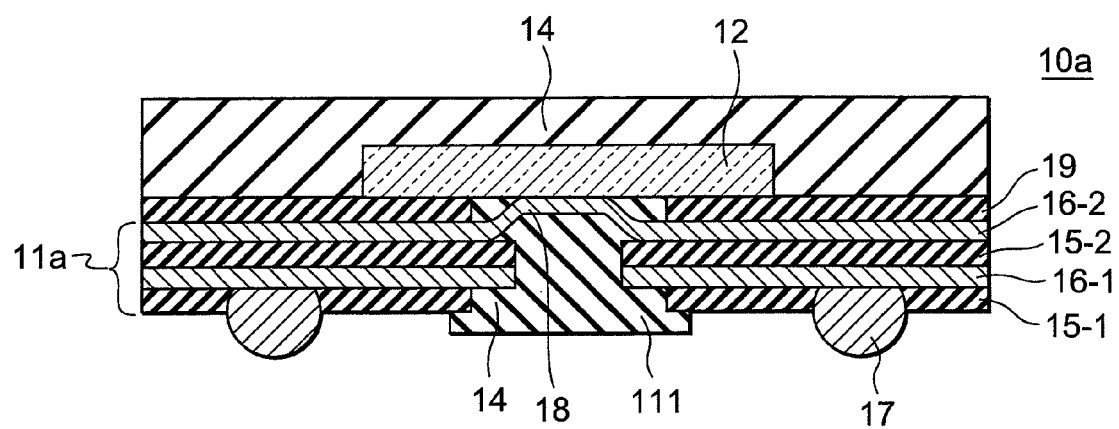
FIG. 8 is a cross-sectional view showing a schematic configuration of a semiconductor package including a package board according to a sixth embodiment of this invention.

FIG. 8 is a cross-sectional view showing a schematic configuration of a semiconductor device according to the sixth embodiment of this invention. Like FIG. 1, FIG. 8 shows a BGA (Ball Grid Array) package structured as a semiconductor device.

This BGA package is a so-called μBGA package, which is different from the one shown in FIG. 1 in that a stress buffer 19 made of an elastomer is employed and the positional relationship between the signal wiring layer (first wiring layer 16-1) and the ground plane layer (second wiring layer 16-2) is reversed.

The shown semiconductor package 10*a* comprises a package board (multi-layer wiring board) 11*a*, a semiconductor chip 12 mounted on the package board 11*a*, an inner lead 18 connecting between the semiconductor chip 12 and wiring lines in the package board 11*a*, and a mold resin 14 sealing the semiconductor chip 12 and the inner lead 18.

The package board 11*a* is formed by alternately stacking an insulation layer 15-1, 15-2 and a second and first wiring layer (metal layer) 16-2, 16-1. The package board 11*a* comprises a solder ball 17 formed on the second wiring layer 16-2 to pass through the insulation layer 15-1 and to be connected to a solder ball land.

Figure 9C:
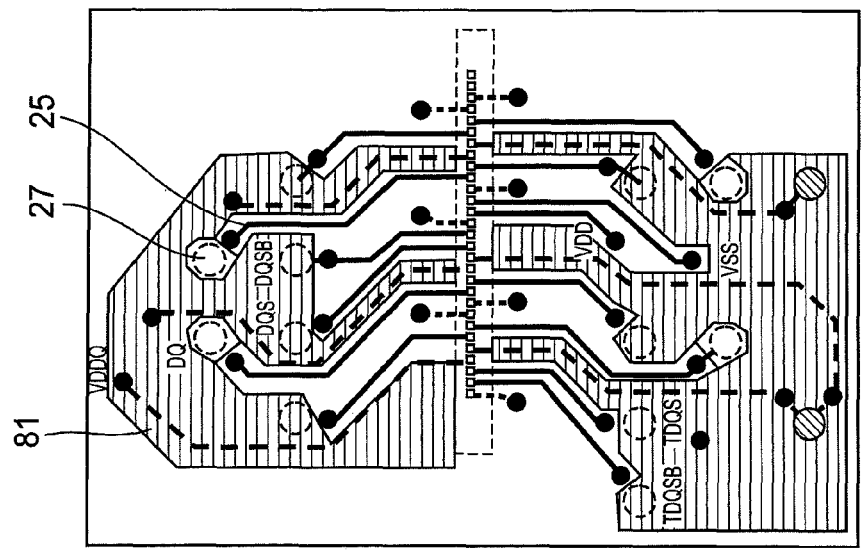
FIG. 9C is a plan view showing the wiring pattern and a power-supply plane (VDDQ) pattern (and the void pattern) formed in the first wiring layer 16-1.
Figure 9B:
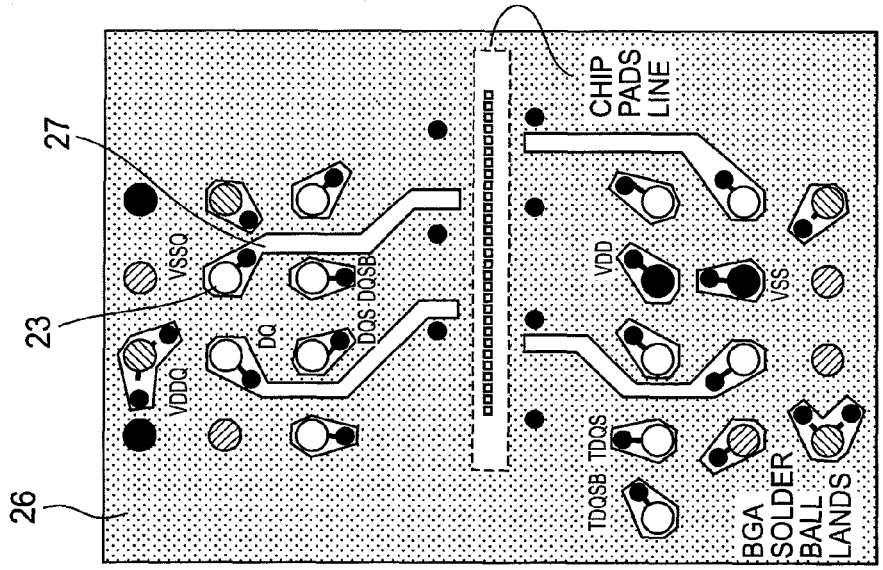
FIG. 9B is a plan view showing a ground plane pattern (and the void pattern) formed in the second wiring layer 16-2.
Figure 9A:
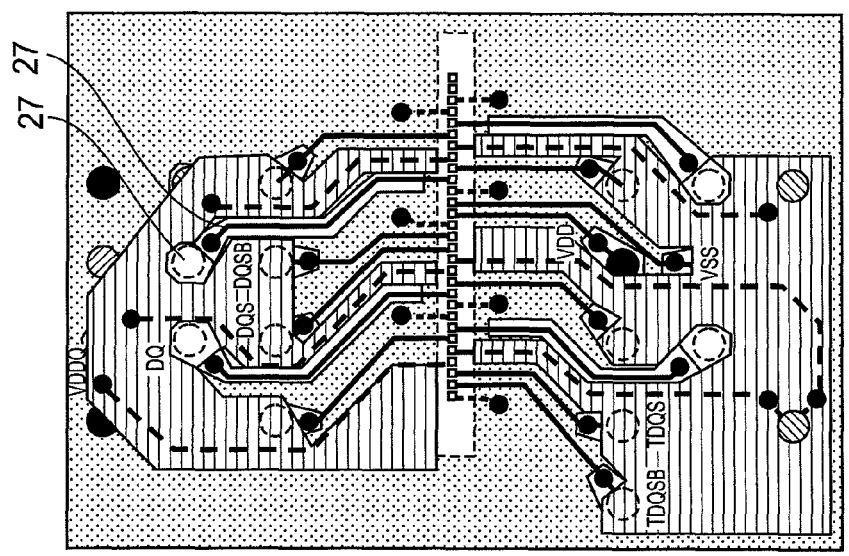
FIG. 9A is a plan view showing a wiring pattern and a void pattern formed in a first wiring layer 16-1 of the package board for use in a semiconductor device of FIG. 8 overlapped with a void pattern formed in a second wiring layer 16-2 thereof.

FIG. 9A is a plan view showing a wiring pattern formed in the first wiring layer 16-1 of the semiconductor package 10*a* of FIG. 8 overlapped with a void pattern formed in the second wiring layer 16-2 thereof. FIG. 9B is a plan view showing a ground plane pattern (and the void pattern) in the second wiring layer 16-2, and FIG. 9C is a plan view showing the wiring pattern and a power-supply plane (VDDQ) pattern (and the void pattern) in the first wiring layer 16-1.

FIG. 9B is largely occupied by a hatched portion which represents a ground plane 26. In other words, the ground plane 26 is formed over a substantially whole area of the surface of the second wiring layer 16-2 (to cover 50% or more of the surface area). In FIG. 9C, the hatched portion occupying a large area not including the signal wiring lines represents a power-supply plane. Although a VDDQ plane 81 for DQ power supply is exemplified in this example, any other power supply and a ground may be arranged together in the form of a plane.

Each void pattern 27 is provided in the second wiring layer 16-2 in correspondence to signal wiring lines 25 formed in the first wiring layer 16-1, and provided also in the first wiring layer 16-1 in correspondence to solder ball lands 23 connected to the signal wiring line 25. In other words, the ground plane 26 and the VDDQ plane 81 are not formed in a region of the second wiring layer 16-2 facing corresponding signal wiring lines 25 or in a region of the first wiring layer 16-1 facing the solder ball lands 23 connected to the signal wiring lines 25. The void patterns 27 are formed to be slightly greater than the signal wiring lines 25 and the solder ball lands 23. Like the second embodiment, a floating pattern may be formed in a region where the void pattern 27 is formed.

Next, a package board for use in a semiconductor device according to a seventh embodiment of this invention will be described.

Figure 10C:
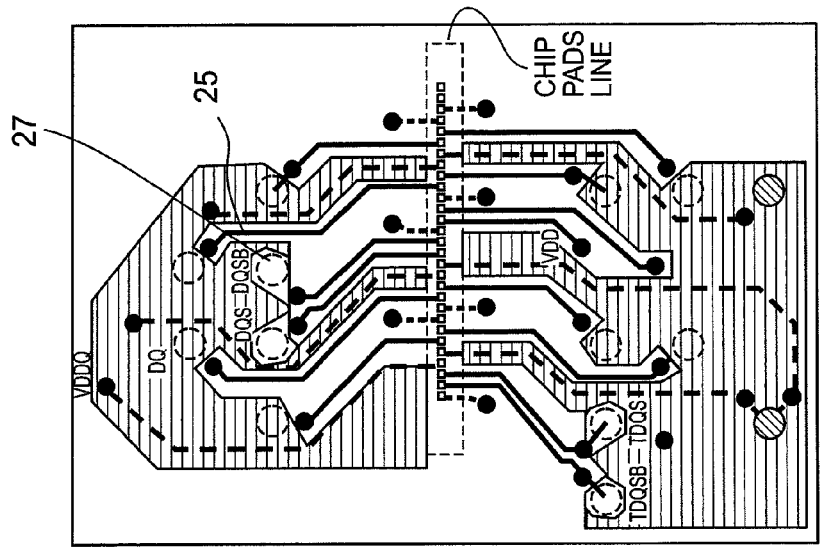
FIG. 10C is a plan view for explaining the package board for use in the semiconductor device according to the seventh embodiment, and showing the wiring pattern and a power-supply plane (VDDQ) pattern (and the void pattern) formed in the first wiring layer 16-1.
Figure 10B:
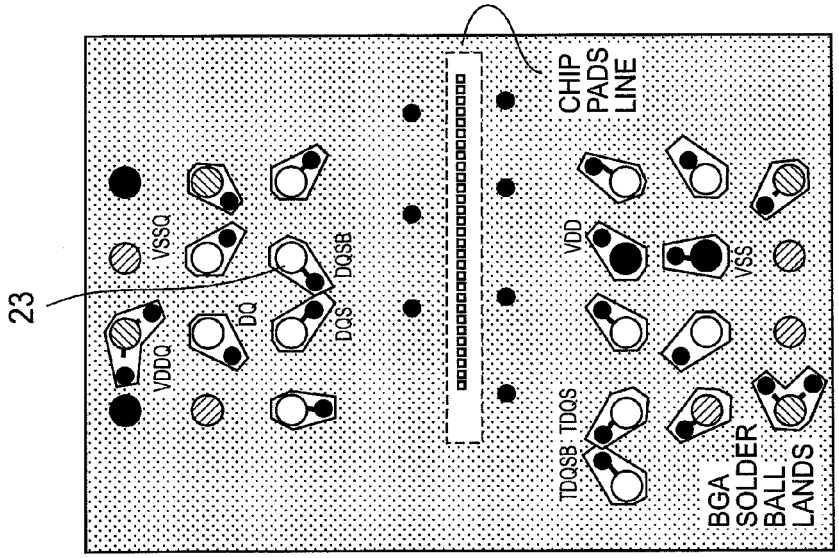
FIG. 10B is a plan view for explaining the package board for use in the semiconductor device according to the seventh embodiment, and showing the ground plane pattern formed in the second wiring layer 16-2.
Figure 10A:
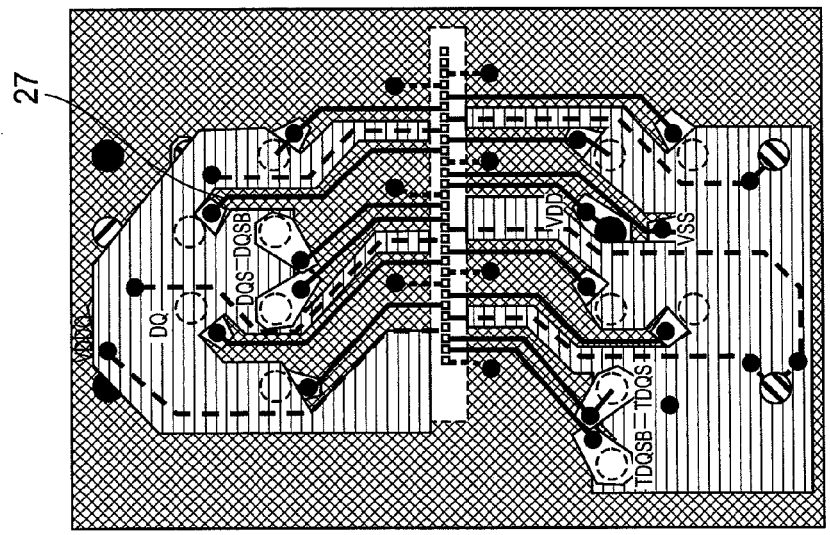
FIG. 10A is a plan view for explaining a package board for use in a semiconductor device according to a seventh embodiment of the invention, and showing a wiring pattern and a void pattern formed in a first wiring layer 16-1 overlapped with a ground plane pattern formed in a second wiring layer 16-2.

The above description of the sixth embodiment has been made in terms of a case in which each void pattern 27 or floating pattern is formed in a region facing the corresponding signal wiring lines 25 and the solder ball lands 23 connected thereto. According to this seventh embodiment, however, as shown in FIG. 10A, FIG. 10B and FIG. 10C, neither void pattern nor floating pattern is formed in a region facing the signal wiring line 25, but a void pattern 27 or floating pattern is formed in a region of the wiring layer 16-1 facing the solder ball land 23 connected to the signal wiring line 25.

The solder ball land 23 occupies a large area, and thus more likely exhibits a large parasitic capacitance with a VDDQ plane, as compared with the signal wiring line 25. Therefore, if the signal wiring line 25 has a parasitic capacitance the value of which is close to a desired value, only the parasitic capacitance generated around the solder ball land 23 need be reduced.

Although the plane assumes a planar shape in the embodiments described so far, the plane may of a mesh-like porous form. The term "plane" as used herein shall mean a pattern in general which is greater in width than a linear wiring line.

Next, a semiconductor device according to an eighth embodiment of this invention will be described.

Figure 11:
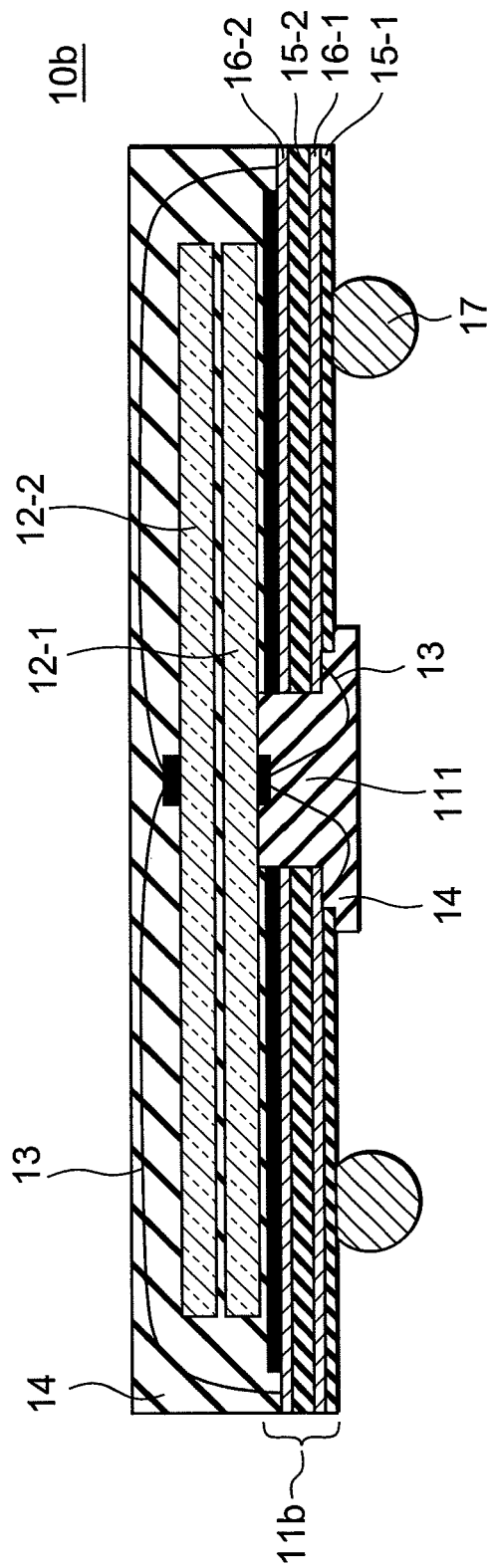
FIG. 11 is a cross-sectional view showing a schematic configuration of a semiconductor device according to an eighth embodiment of this invention.

FIG. 11 is a cross-sectional view showing a schematic configuration of a semiconductor device 10*b* according to the eighth embodiment of this invention.

Like FIG. 1, FIG. 11 shows a BGA (Ball Grid Array) package as an example of a semiconductor device.

The shown semiconductor device 10*b* has a package board (multi-layer wiring board) 11*b*, semiconductor chips 12-1, 12-2 stacked on the package board 11b, bonding wires 13 connecting between the semiconductor chips 12-1 12-2, and wiring lines in the package board 11b, and mold resin portions 14 sealing the semiconductor chips 12 and the inner lead 111.

The package board 11b is formed by alternately stacking an insulation layer 15-1, 15-2 and first and second wiring layers (metal layers) 16-1, 16-2 in the above-mentioned manner.

The package board 11b has a slot (opening) 111 formed in the center thereof. The package board 11b also has solder balls 17 which are formed on the lower face side thereof and which are allowed to pass through the insulation layer 15-1 to be connected to the solder ball lands.

As shown in FIG. 11, the semiconductor chips 12-1,12-2 are stacked in a state reversed to each other, and are mounted on the package board 11b. In other words, a pair of the semiconductor chips is stacked in a reversed state each other.

The semiconductor chip 12-1 is electrically connected to the wiring lines of the package board 11b at the center thereof via slot 111 by the use of bonding wires 13. On the other hand, the semiconductor chip 12-2 is electrically connected to the wiring lines of the package board 11b at a peripheral portion of the package board 11b by the use of bonding wires 13.

In addition, bonding pads of the first semiconductor chip 12-1 and the corresponding bonding pads of the second semiconductor chip 12-2 are connected to the same wiring lines of the package board 11b except pads for control signals (CSB, CKE, ODT or the like) controlling two chips separately.

For example, the bonding pads of the first semiconductor chip 12-1 for the data strobe signals (DQS, DQSB) and the bonding pads of the second semiconductor chip 12-1 for the data strobe signals are connected to the same external terminals (solder balls 17).

Figure 12C:
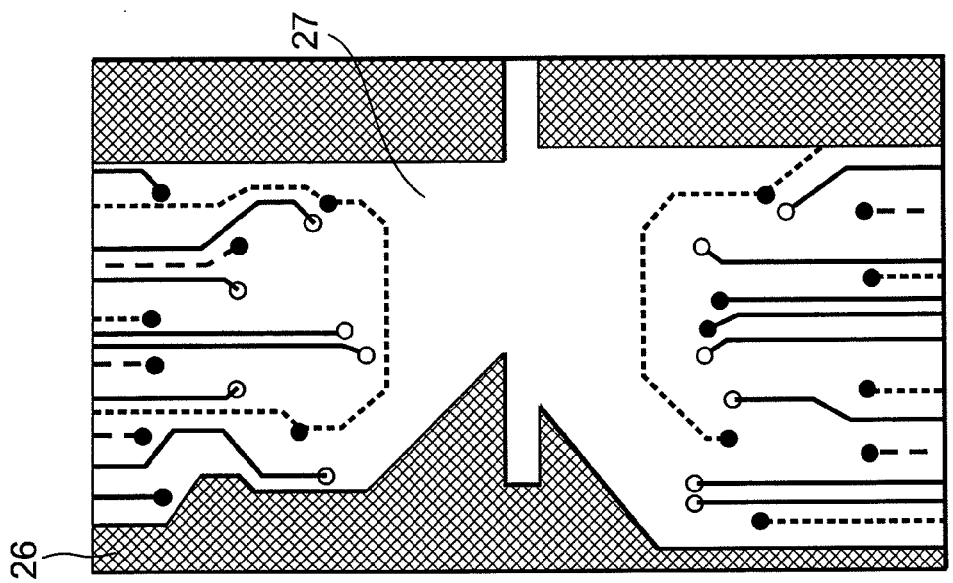
FIG. 12C is a plan view showing a ground plane (VSSQ) pattern (and the void pattern) formed in the second wiring layer 16-2.
Figure 12B:
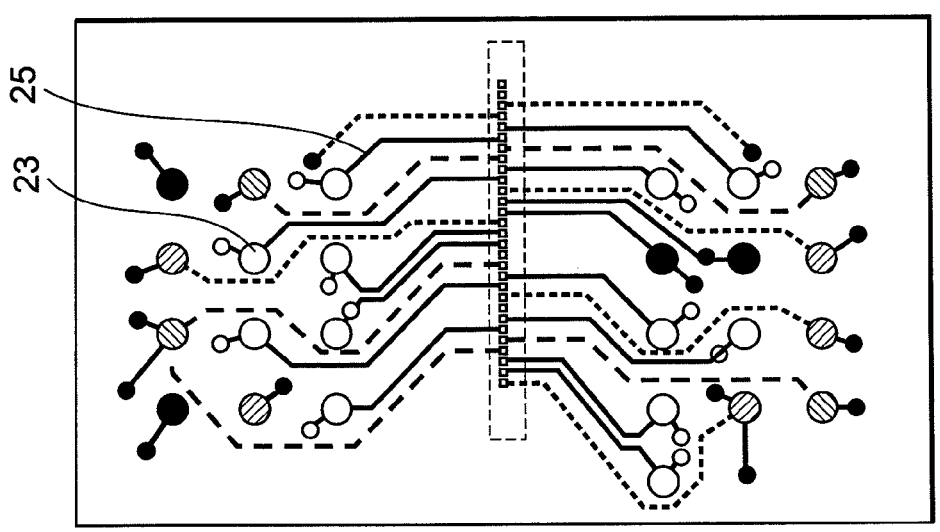
FIG. 12B is a plan view showing the wiring pattern formed in the first wiring layer 16-1.
Figure 12A:
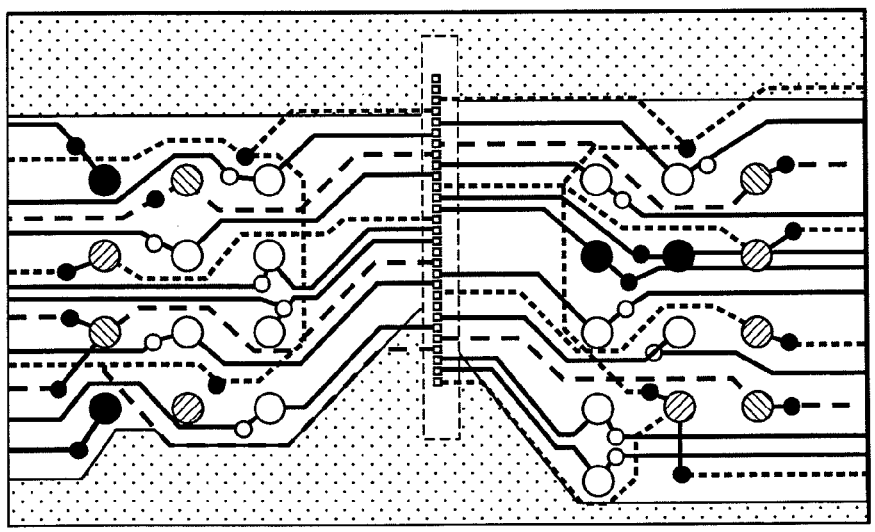
FIG. 12A is a plan view showing a wiring pattern formed in a first wiring layer 16-1, of the package board for use in the semiconductor device of FIG. 11 overlapped with a void pattern in a second wiring layer 16-2 thereof.

FIG. 12A is a plan view showing a state of overlapping a wiring pattern formed in the first wiring layer 16-1 illustrated in FIG. 11 with a wiring pattern and a ground plane pattern (void pattern) formed in the second wiring layer 16-2 illustrated in FIG. 11. FIG. 12B is a plan view showing the wiring pattern formed in the first wiring layer 16-1 while FIG. 12C is a plan view showing a wiring pattern and a ground plane (VSSQ) pattern (and the void pattern) formed in the second wiring layer 16-2.

FIG. 12C is largely occupied by a hatched portion which represents a ground plane 26 (VSSQ plane used for a ground plane of DQ lines). The ground plane 26 occupies both side ends of FIG. 12C.

This ground plane 26 is formed in the second wiring layer 16-2 so that it avoids regions which are opposite to the wiring lines and solder ball lands formed in the first wiring layer 16-1.

In other words, a void pattern 27 is formed in the regions of the second wiring layer 16-2 and is opposite to the signal wiring lines 25 and the solder ball lands 23 connected to these signal wiring lines 25 in the second wiring layer 16-1 while a plane fixed to a power supply potential (a wiring pattern which has a width wider than a signal wiring) is not formed in this region.

In addition, instead of forming the void pattern 27, a floating pattern may be formed in the second wiring layer 16-2 to be electrically isolated from the VSSQ wiring line.

Next, a semiconductor device according to a ninth embodiment of this invention will be described.

Figure 13:
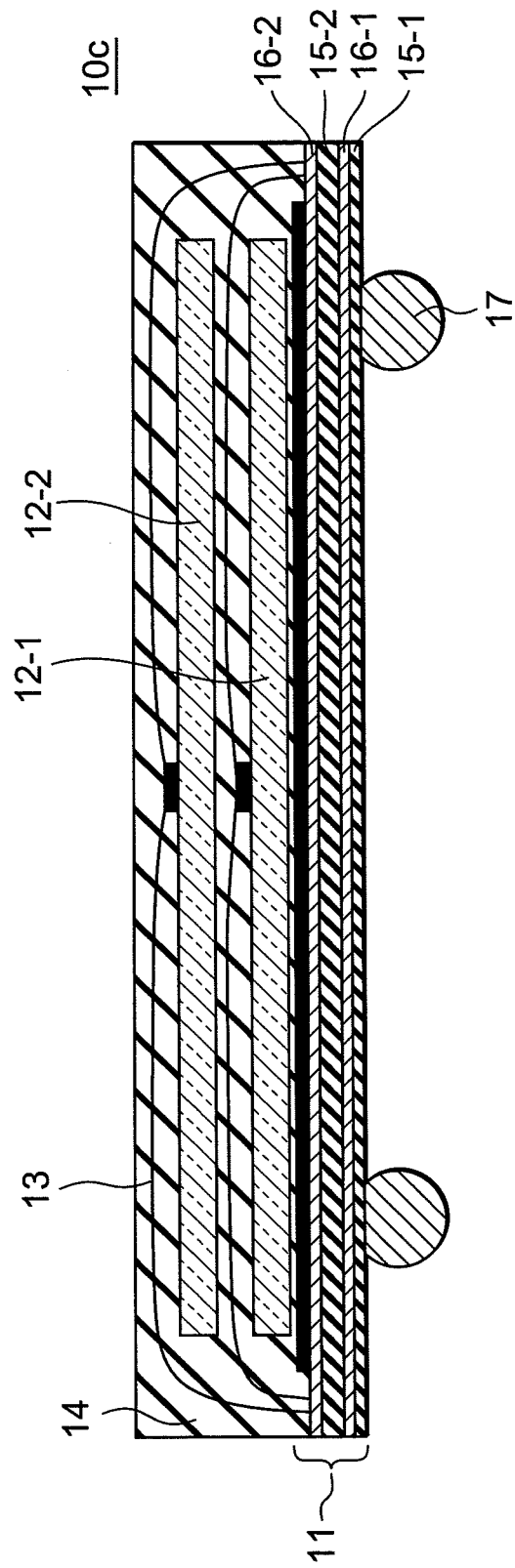
FIG. 13 is a cross-sectional view showing a schematic configuration of a semiconductor device according to an eighth embodiment of this invention.

FIG. 13 is a cross-sectional view showing a schematic configuration of a semiconductor device 10c according to a ninth embodiment of this invention.

Like FIG. 1, FIG. 13 also shows a BGA (Ball Grid Array) package as an example of a semiconductor device.

Although the description of the eighth embodiment has been made about the case where the semiconductor chips 12-1,12-2 are stacked in a reversed state each other, the ninth embodiment differs from the eighth embodiment in view of the fact that the semiconductor chips 12-1, 12-2 of the ninth embodiment are stacked in the same direction.

In this case, the semiconductor chip 12-1,12-2 are electrically connected to the wiring lines of the package board 11c at the peripheral portion thereof by the use of bonding wires 13. With this structure, it is possible to shorten wiring lengths as compared with the eighth embodiment because each bonding wire 13 of both semiconductor chips 12-1, 12-2 connected to the same pads can be very closely wired to each other.

Figure 14C:
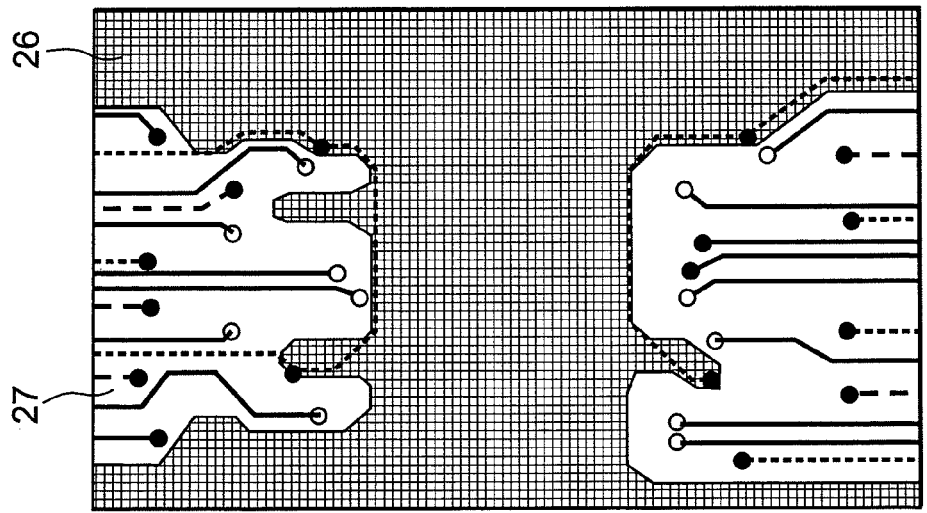
FIG. 14C is a plan view showing a ground plane pattern (and the void pattern) formed in the second wiring layer 16-2.
Figure 14B:
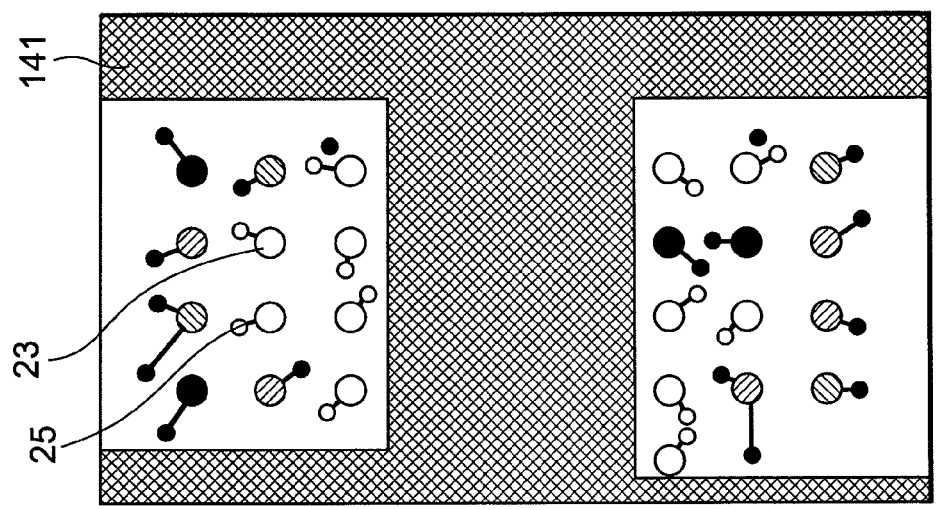
FIG. 14B is a plan view showing the wiring pattern formed in the first wiring layer 16-1.
Figure 14A:
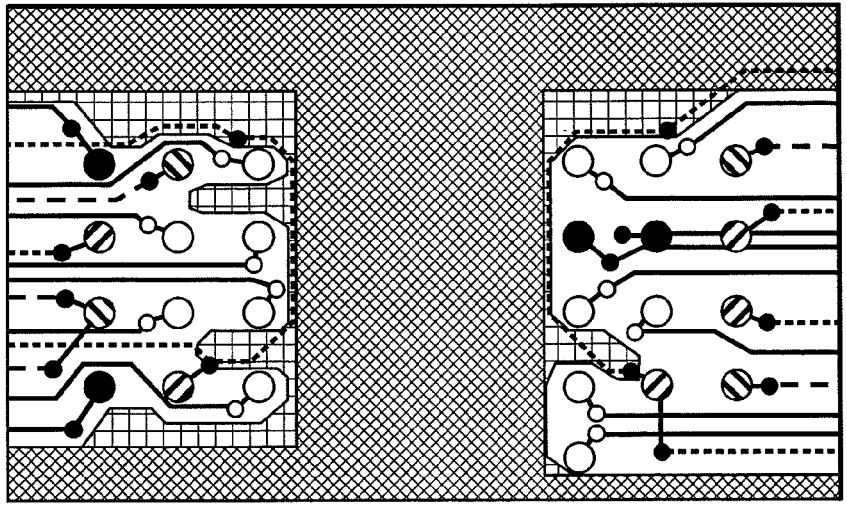
FIG. 14A is a plan view showing a wiring pattern and a floating pattern formed in a first wiring layer 16-1, of the package board for use in the semiconductor device of FIG. 13 overlapped with wiring pattern and void pattern in a second wiring layer 16-2 thereof.

FIG. 14A is a plan view showing a state of overlapping a wiring pattern and a floating pattern formed in the first wiring layer 16-1 illustrated in FIG. 13 overlapped with wiring pattern with a ground plane pattern formed in the second wiring layer 16-2 thereof. FIG. 14B is a plan view showing the wiring pattern and the floating pattern formed in the first wiring layer 16-1, while FIG. 14C is a plan view showing a ground plane (VSSQ) pattern (and the void pattern) 26 formed in the second wiring layer 16-2.

FIG. 14B is largely occupied by a hatched portion which represents a floating pattern 141. As illustrated in FIG. 14B, the floating pattern 141 occupies both side areas and a central area of the first wiring layer 16-1.

This floating pattern 141 formed in the second wiring layer 16-2 avoids regions facing the wiring lines and solder ball lands formed in the first wiring layer 16-1.

In other words, a void pattern 27 of the first wiring layer 16-1 is formed in the regions which are opposite to the signal lines of the second wiring layer 16-2.

In addition, instead of forming the void pattern 27, a power-supply (VDD) plane fixed to a power supply potential, a floating plane, or a DQ power-supply plane may be formed in the second wiring layer 16-2. In this case, each plane is formed in the second wiring layer 16-2 so as to avoid regions facing the wiring lines 25 in the first wiring layer 16-1. In other words, a wiring pattern which is wider than a signal wiring line and fixed to power supply potential is not formed in this region.

Moreover, FIG. 14C is largely occupied by a hatched portion which represents a ground plane pattern 26 (VSSQ plane that is a DQ ground is employed herein). The ground plane pattern 26 occupies both side areas and a central area of FIG. 14C.

A ground plane pattern 26 is formed in the second wiring layer 16-2 so that it avoids regions facing the wiring line and solder ball land in the first wiring layer 16-1.

In other words, a void pattern 27 is formed in the regions of the second wiring layer 16-2 so that it faces the signal wiring lines 25 and the solder ball lands 23 in the first wiring layer 16-1, but a power-supply (VDD) plane fixed to power supply potential is not formed in the second wiring layer 16-2. In addition, instead of forming the ground plane pattern 26, a floating pattern may be formed in the second wiring layer 16-2 to be electrically isolated from the VSSQ wiring line.

Although the inventions has been described above in connection with several preferred embodiments thereof, it will be appreciated by those skilled in the art that those embodiments are provided solely for illustrating the invention, and should not be relied upon to construe the appended claims in a limiting sense. For example, although the foregoing embodiments have been described in terms of the case where two wiring layers are provided, this invention is also applicable to a package board having three or more wiring layers. Further, although the foregoing embodiments have been described in terms of the case where a void pattern or floating pattern is formed in a wiring layer where a ground plane is formed, a similar void pattern or floating pattern may be provided in a wiring layer where a power-supply plate is formed. It should be understood that a void pattern or floating pattern may be provided both in a wiring layer having a ground plane formed therein and in a wiring layer having a power-supply layer formed therein.

What is claimed is:

1. A semiconductor device comprising:
an insulating layer having one surface and the other surface opposite to the one surface, the one surface including a first region, and the other surface including a second region that corresponds in position to the first region;
a first wiring pattern formed on the one surface of the insulating layer, the first wiring pattern including a conductive plane supplied with one of a power supply potential and a ground potential, the conductive plane including a continuous partial void region to expose the first region of the one surface of the insulating layer; and
a second wiring pattern formed on the other surface of the insulating layer, the second wiring pattern including a signal wiring line and a solder ball land connected to the signal wiring line, at least one of the signal wiring line and the solder ball land being formed within the second region of the other surface of the insulating layer;
wherein the continuous partial void region covers the signal wiring line and is greater in width than width of the at least one of the signal wiring line and the solder ball land.

2. The device as claimed in claim 1, wherein both of the signal wiring line and the solder ball land are formed within the second region of the other surface of the insulating layer, and the partial void region of the conductive plane is greater in width than width of each of the signal wiring line and the solder ball land.

3. The device as claimed in claim 1, wherein the second wiring pattern includes an additional signal wiring line and an additional solder ball land connected to the additional signal wiring line, at least one of the additional signal wiring line and the additional solder ball land being formed within the second region of the other surface of the insulating layer together with the at least one of the signal wiring line and the solder ball land, and the partial void region of the conductive plane is greater in width than width of a sum of the at least one of the signal wiring line and the solder ball land and the at least one of the additional signal wiring line and the additional solder ball land.

4. The device as claimed in claim 3, wherein both of the signal wiring line and the solder ball land and both of the additional signal wiring line and the additional solder ball land are formed within the second region of the other surface of the insulating layer, and the partial void region of the conductive plane is further greater in width than width of a sum of the other of the signal wiring line and the solder ball land and the other of the additional signal wiring line and the additional solder ball land.

5. The device as claimed in claim 1,
wherein the one surface further includes a third region;
wherein the other surface further includes a fourth region that corresponds in position to the third region;
wherein the conductive plane further includes an additional partial void region to expose the third region of the one surface of the insulating layer;
wherein the second wiring pattern further includes an additional signal wiring line and an additional solder ball land connected to the additional signal wiring line, at least one of the additional signal wiring line and the additional solder ball land being formed within the fourth region of the other surface of the insulating layer; and
wherein the additional partial void region of the conductive plane is greater in width than width of the at least one of the additional signal wiring line and the additional solder ball land.

6. The device as claimed in claim 5, wherein both of the additional signal wiring line and the additional solder ball land are formed-within the fourth region of the other surface of the insulating layer, and the additional partial void region of the conductive plane is greater in width than width of each of the additional signal wiring line and the additional solder ball land.

7. The device as claimed in claim 1, further comprising a semiconductor chip that is mounted over the insulating layer on a side of the first wiring pattern and includes at least one electrode pad electrically connected to the signal wiring line of the second wiring pattern.

8. The device as claimed in claim 7, wherein the insulating layer includes a slit, and the device further comprises a wire passing through the slit of the insulating layer to connect the electrode pad of the semiconductor pad to the signal wiring line of the second wiring pattern.

9. A semiconductor device comprising:
an insulating layer having one surface and the other surface opposite to the one surface, the one surface including a first region, and the other surface including a second region that corresponds in position to the first region;
a first wiring pattern formed on the one surface of the insulating layer, the first wiring pattern including a conductive plane supplied with one of a power supply potential and a ground potential, the conductive plane including a continuous partial void region to expose the first region of the one surface of the insulating layer; and
a second wiring pattern formed on the other surface of the insulating layer, the second wiring pattern including a signal wiring line and a solder ball land connected to the signal wiring line, the solder ball land being formed within the second region of the other surface of the insulating layer;
wherein the continuous partial void region covers the signal wiring line and is greater in width than width of the solder ball land.

10. The device as claimed in claim 9, wherein at least one part of the signal wiring line is formed within the second region of the other surface of the insulating layer together with the solder ball land, and the partial void region of the conductive plane is further greater in width than width of the at least one part of signal wiring line.

11. The device as claimed in claim 9,
wherein the one surface further includes a third region;
wherein the other surface further includes a fourth region that corresponds in position to the third region;
wherein the conductive plane further includes an additional partial void region to expose the third region of the one surface of the insulating layer;
wherein the second wiring pattern further includes an additional signal wiring line and an additional solder ball land connected to the additional signal wiring line, the additional solder ball land being formed within the fourth region of the other surface of the insulating layer; and wherein the additional partial void region of the conductive plane is greater in width than width of the additional solder ball land.

12. The device as claimed in claim 11, wherein at least one part of the additional signal wiring line is formed within the fourth region of the other surface of the insulating layer together with the additional solder ball land, and the additional partial void region of the conductive plane is further greater in width than width of the at least one part of the additional signal wiring line.

13. The device as claimed in claim 9, further comprising a semiconductor chip that is mounted over the insulating layer on a side of the first wiring pattern and includes at least one electrode pad electrically connected to the signal wiring line of the second wiring pattern.

14. The device as claimed in claim 13, wherein the insulating layer includes a slit, and the device further comprises a wire passing through the slit of the insulating layer to connect the electrode pad of the semiconductor pad to the signal wiring line of the second wiring pattern.

15. A semiconductor device comprising:
an insulating layer having one surface and the other surface opposite to the one surface, the one surface including a first region, and the other surface including a second region that corresponds in position to the first region;
a first wiring pattern formed on the one surface of the insulating layer, the first wiring pattern including a first conductive plane supplied with one of a power supply potential and a ground potential, the first conductive plane including a first continuous partial void region to expose the first region of the one surface of the insulating layer, the first wiring pattern further including a first signal line that is formed within the first region; and
a second wiring pattern formed on the other surface of the insulating layer, the second wiring pattern including a second conductive plane supplied with the other of the power supply potential and the ground potential, the second conductive plane including a second partial void region to expose the second region of the other surface of the insulating layer, the second wiring pattern further includes a first solder ball land that is formed within the second region;
wherein the first continuous partial void region covers the first signal line and is greater in width than width of the first solder ball land and the second partial void region of the second conductive plane is greater in width than width of the first signal line.

16. The device as claimed in claim 15, wherein the insulating layer includes a through electrode that penetrates therethrough between the first and second regions, and the first signal line is electrically connected to the first solder ball land through the through electrode.

17. The device as claimed in claim 16, wherein the first wiring pattern further includes a second signal line that is formed within the first region with overlapping the second conductive plane with an intervention of the insulating layer therebetween.

18. The device as claimed in claim 17, wherein the second conductive plane includes a third partial void region that exposes a third region of the other surface of the insulating layer, and the second wiring pattern includes a second solder land that is formed within the third region and electrically connected to the second signal line through an additional through electrode.

19. The device as claimed in claim 15, further comprising a semiconductor chip that is mounted over the insulating layer on a side of the first wiring pattern and includes at least one electrode pad electrically connected to the signal wiring line of the second wiring pattern.

* * * * *